(12) United States Patent
Robl et al.

(10) Patent No.: US 10,432,207 B2
(45) Date of Patent: Oct. 1, 2019

(54) CLOCK GENERATOR

(71) Applicant: Lockheed Martin Corporation, Bethesda, MD (US)

(72) Inventors: Douglas Alexander Robl, Collingswood, NJ (US); Brandon Robert Davis, Mt. Laurel, NJ (US); Donald Lafrance, Willingboro, NJ (US); Joseph B. Zubah, Jr., Darby, PA (US); Mark Dickmann, Mt. Laurel, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 15/858,591

(22) Filed: Dec. 29, 2017

(65) Prior Publication Data

US 2019/0207613 A1    Jul. 4, 2019

(51) Int. Cl.
| | | |
|---|---|---|
| *H03M 1/06* | (2006.01) | |
| *H03K 3/023* | (2006.01) | |
| *G06F 1/04* | (2006.01) | |
| *H03F 3/45* | (2006.01) | |

(52) U.S. Cl.
CPC .......... *H03M 1/0624* (2013.01); *H03K 3/023* (2013.01); *G06F 1/04* (2013.01); *H03F 3/45071* (2013.01); *H03F 2200/165* (2013.01); *H03F 2203/45051* (2013.01)

(58) Field of Classification Search
CPC ..... G06F 1/00; G06F 1/04; G06F 1/08; G06F 1/10; G11C 7/00; G11C 7/22; H03F 2200/00; H03F 2200/165; H03F 2203/00; H03F 2203/45051; H03F 3/00; H03F 3/45071; H03K 3/00; H03K 3/023; H03K 5/00; H03K 5/135; H03M 1/00; H03M 1/0624
USPC ........................................................ 327/291
See application file for complete search history.

(56) References Cited

U.S. PATENT DOCUMENTS

| | | | |
|---|---|---|---|
| 8,487,795 B1* | 7/2013 | Jiang ..................... | G11C 27/024 327/415 |
| 8,669,799 B1* | 3/2014 | King ..................... | H03K 5/1565 327/172 |
| 9,531,356 B1 | 12/2016 | Delos et al. | |
| 2002/0084806 A1* | 7/2002 | Yang ..................... | H03K 19/086 326/127 |
| 2011/0150495 A1* | 6/2011 | Nosaka .................. | H03H 11/20 398/135 |
| 2011/0248780 A1* | 10/2011 | Berg ......................... | H03F 3/45 330/250 |
| 2014/0086364 A1* | 3/2014 | Schell ..................... | H03H 7/06 375/340 |

* cited by examiner

*Primary Examiner* — Lincoln D Donovan
*Assistant Examiner* — Dave Mattison
(74) *Attorney, Agent, or Firm* — Howard IP Law Group PC

(57) ABSTRACT

An integrated circuit comprises an ADC including a first track-and-hold amplifier and a timing generator configured to generate a clock signal for controlling the ADC. The timing generator comprises a quadrature filter responsive to a differential input signal for generating a differential quadrature (I/Q) output signal. The timing generator further comprises at least one first vector sum circuit operatively coupled or connected to an output of the quadrature filter and configured to weight and sum components of the differential I/Q output signal for generating a clock signal having a desired delay.

20 Claims, 8 Drawing Sheets

CLOCK GENERATOR

FIELD OF THE INVENTION

This disclosure relates to electronic circuits. More particularly, the disclosure relates to clock signal generators for use in digital circuits.

BACKGROUND OF THE INVENTION

Modern digital systems rely on multiple clock signals to synchronize data flows through their circuits. In systems such as analog-to-digital converters (ADCs), clock timing is an important factor impacting system performance. Clock skew (i.e. the time between clock edges arriving at different circuits) must be tightly controlled in order to maximize settling time for low noise and low spurs. In digital circuits, phase noise occurs due to errors in the clock edges of the digital circuit. Phase noise in a circuit may arise from various sources. For example, fluctuations in current and temperature affect the properties of charge carriers in the conductors of the circuit and introduce random noise. Phase noise also appears as additional frequency components due to short term fluctuations that show up as side bands to the desired signal frequency. Duty cycle must also be accurately controlled for the same reasons. Moreover, given the spatial differences between the circuits that need clock signals, a clock signal generator is needed to provide control over clock skew and duty cycle.

A common solution to this control challenge is to generate clock signals off of ramp-like (triangular) waveforms. By applying direct-current (DC) thresholds to create clock edges, skew and duty control can be achieved with reasonably good precision. Another approach is to employ a Delay Locked Loop (DLL), which uses a programmable delay line and feedback to minimize skew across a device or chip. Improved performance over either of these solutions is required for many applications, however. Ramp generators can only provide from 0 to 180 degrees of edge control and are often complex circuits with many power consuming devices. And while DLLs can provide more, they do so with a very high power consumption.

Alternative systems and methods for generating clock signals in integrated circuits are desired.

SUMMARY

An integrated circuit according to embodiments of the present disclosure includes a timing generation circuit or timing generator configured to generate a plurality of clock signals. The timing generator comprises an input clock buffer configured to receive an input differential signal and a quadrature (I/Q) filter operatively connected to the output of the clock buffer. A first I/Q buffer amplifier is operatively connected to an output of the quadrature filter, and a second I/Q buffer amplifier is operatively connected to the first I/Q buffer amplifier. At least one first vector sum circuit is responsive to an output differential I/Q signal of the second I/Q buffer amplifier and to at least one input control signal for delaying, or shifting the phase of, the differential I/Q signal output of the second I/Q buffer amplifier.

An integrated circuit according to another embodiment of the present disclosure comprises an ADC including a first track-and-hold amplifier and a timing generator configured to generate a clock signal for controlling the ADC. The timing generator comprises a quadrature (I/Q) filter responsive to a differential input signal for generating a differential I/Q output signal. The timing generator further includes at least one first vector sum circuit operatively connected to the output of the quadrature filter that is configured to, in response to a control signal, weight and sum components of the differential I/Q output signal for generating a clock signal having a desired time delay or phase shift.

A method for generating a clock signal in an integrated circuit is also provided. The method comprises the steps of buffering a differential input clock signal with an input clock buffer. The buffered input clock signal is received by a quadrature (I/Q) filter for generating a differential I/Q output signal. The I/Q output signal is provide to a vector sum circuit, wherein differential I and Q components of the output signal are weighted according to a plurality of received input control signals, and summed for generating a first desired output clock signal.

DETAILED DESCRIPTION

Figure 1:
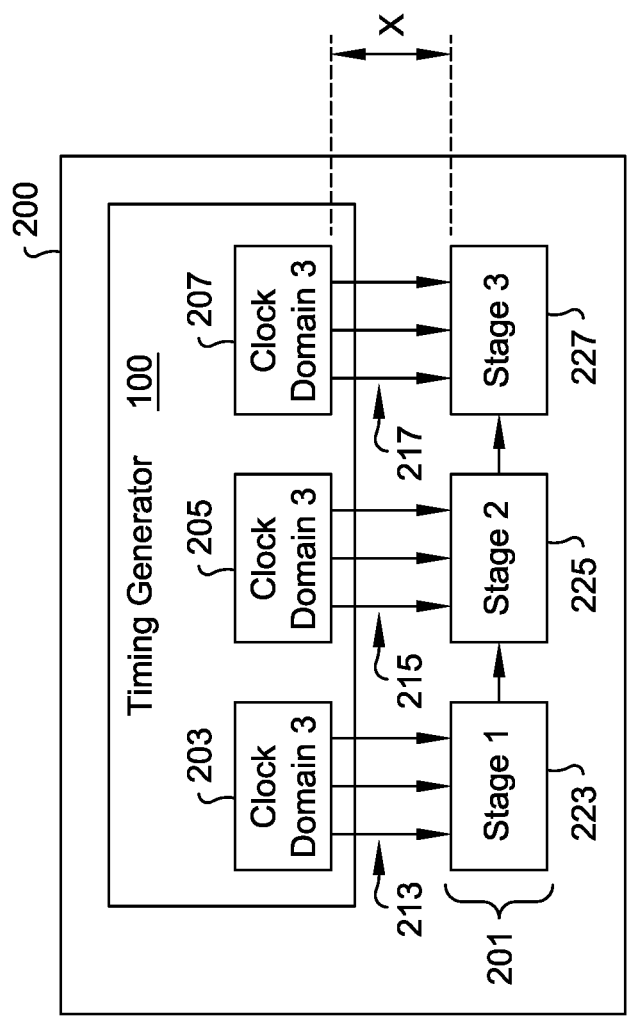
FIG. 1 is a simplified block diagram of an integrated circuit including an ADC and an on-board clock generation circuit according to embodiments of the present disclosure.

It is to be understood that the figures and descriptions of the present invention have been simplified to illustrate elements that are relevant for a clear understanding of the present invention, while eliminating, for purposes of clarity, many other features found in integrated circuits, such as multi-stage ADCs and clock signal generating circuits. However, because such elements and processes are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the inventions may be practiced. It is to be understood that the various embodiments of the inventions, although different, are not necessarily mutually exclusive. Furthermore, a particular feature, structure, or characteristic described herein in connection with one embodiment may be implemented within other embodiments without departing from the scope of the inventions. In addition, it is to be understood that the location or arrangement of individual elements within each disclosed embodiment may be modified without departing from the scope of the inventions. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

Embodiments of the present disclosure implement principles of wideband active phase shifters into an improved clock generator for realizing improved performance and finer control than prior art approaches. In one embodiment, a clock generator is configured to create a squared waveform from a received differential input signal using a low jitter buffer amplifier. The resulting signal will by used by the first track-and-hold (T/H) amplifier of an ADC and a wideband quadrature filter for timing generation. The waveform is de-squared when received by the wideband quadrature filter for generating in-phase and quadrature (I/Q) differential vectors or signals. These I/Q vector pairs may be divided or split a predetermined number of times, depending on the number of desired output clock signals. Each resulting I/Q vector is buffered and distributed to a respective vector sum circuit, which controls clock skew according to one or more input analog control signals. This control signal may be generated, in part, by a digital-to-analog converter (DAC), providing fine control of the clock skew. Each vector sum circuit has two clock outputs which are skewed relative to each other, buffered, and then fed through a current mode logic (CML) AND gate, for duty cycle control. Embodiments of the present invention improve the current state of the art by providing a full 360 degrees of edge control coverage with a simplified design that consumers less power and requires less space on the integrated circuit.

FIG. 1 provides a high-level block diagram of an integrated circuit 200 including a multi-stage ADC 201 and an integrated on-board timing generator 100 according to embodiments of the present disclosure. As will be set forth in greater detail herein, timing generator 100 is configured to provide a plurality of clock signals for controlling the operations of ADC 201. More specifically, timing generator may 100 may define a plurality of clock domains 203,205, 207. Each clock domain 203,205,207 may be configured to generate and distribute groups of clock signals 213,215,217 to a respective converter stage 223,225,227 of ADC 201 for control thereof. Each clock domain 203,205,207 comprises a sub-set or grouping of components of timing generator 100. Clock domains 203,205,207 are positioned approximately equidistant (e.g., at an exemplary illustrated distance X) from a respective converter stage 223,225,227 under control thereby. In this way, control or clocking errors introduced by spatial differences between components of the converter stages and the associated components of the clock signal generator are normalized and/or minimized.

Figure 2:
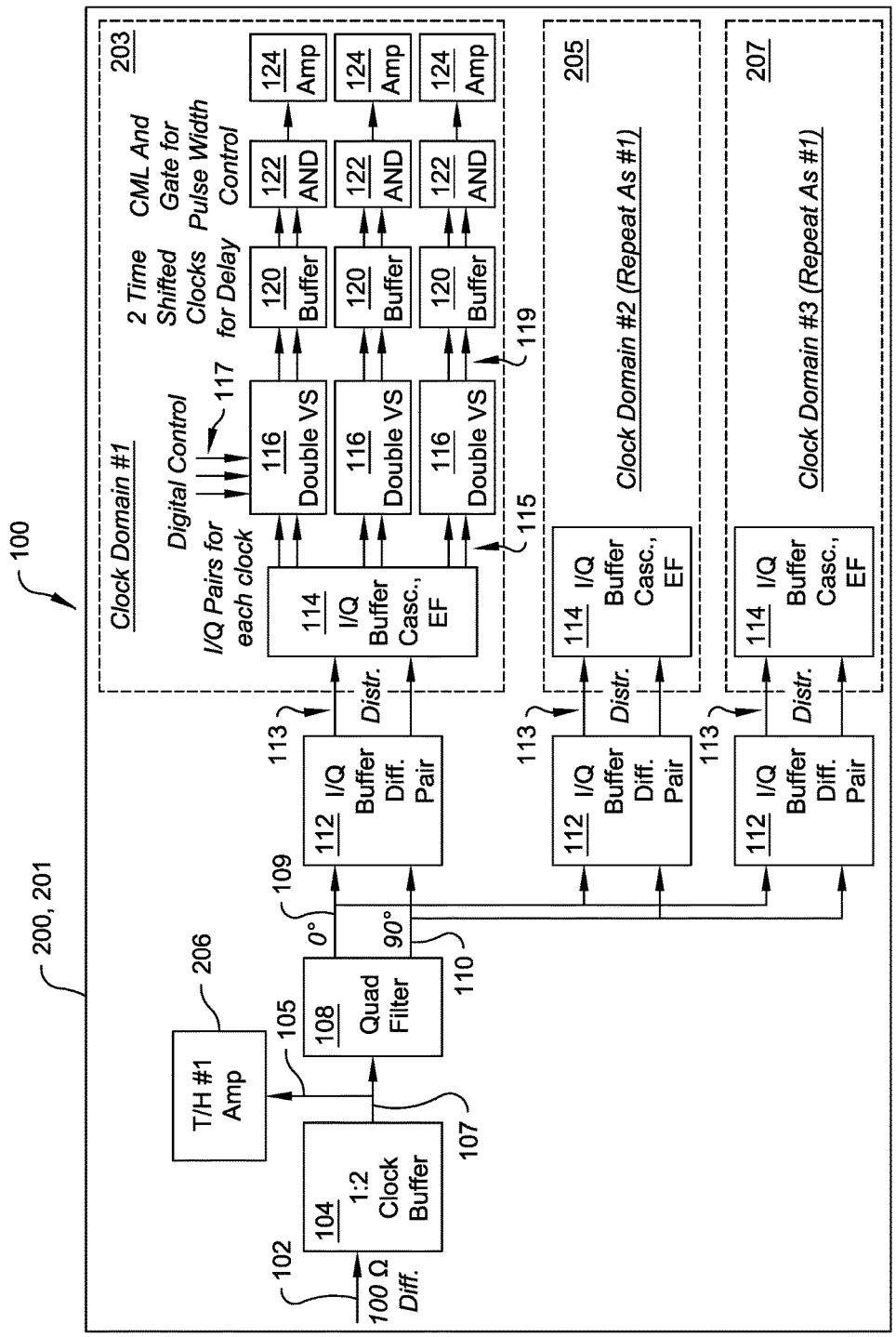
FIG. 2 is a simplified block diagram of a clock generation circuit according to embodiments of the present disclosure.
Figure 4:
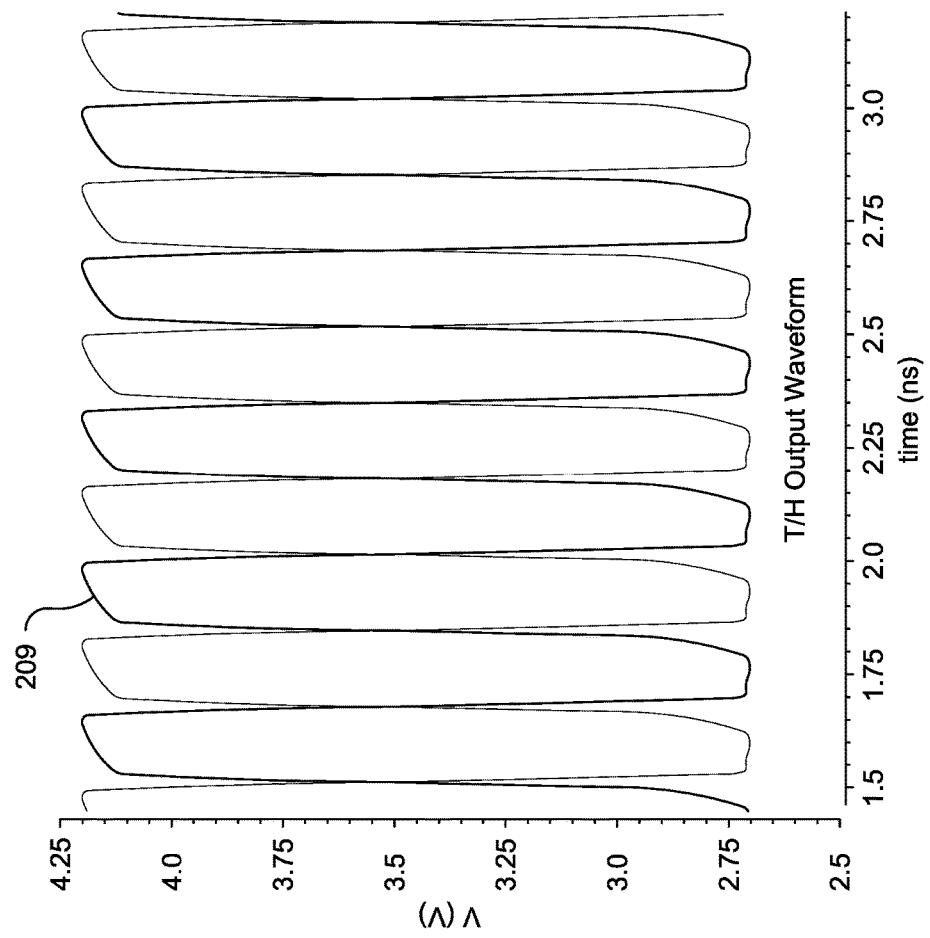
FIG. 4 is a graph illustrating an exemplary output differential waveform from a track-and-hold amplifier of an ADC according to an embodiment of the disclosure.

Referring generally to FIG. 2, a high-level block diagram illustrating a timing generator 100 incorporated into integrated circuit 200 according to embodiments of the present disclosure is shown. An input signal, and more specifically, a continuous wave (CW) differential input signal 102 is provided to a 1:2 clock buffer or amplifier 104 for generating first and second replica differential output signals 105,107. An exemplary CW input signal may comprise a +10 dBm input level. First output signal 105 is provided to a T/H amplifier 206 of ADC 201 incorporated into common integrated circuit or chip 200. T/H amplifier 206 is configured to square output signal 105 to reduce slew rate sensitive jitter. An exemplary output differential waveform or first clock signal 209 from T/H amplifier 206 is shown in FIG. 4. As will be understood by one of ordinary skill in the art, the jitter present in first clock signal 209 sets the performance ceiling of ADC 201, and as such, components and design should choices should be aimed at keeping this jitter as low as possible.

Figure 5:
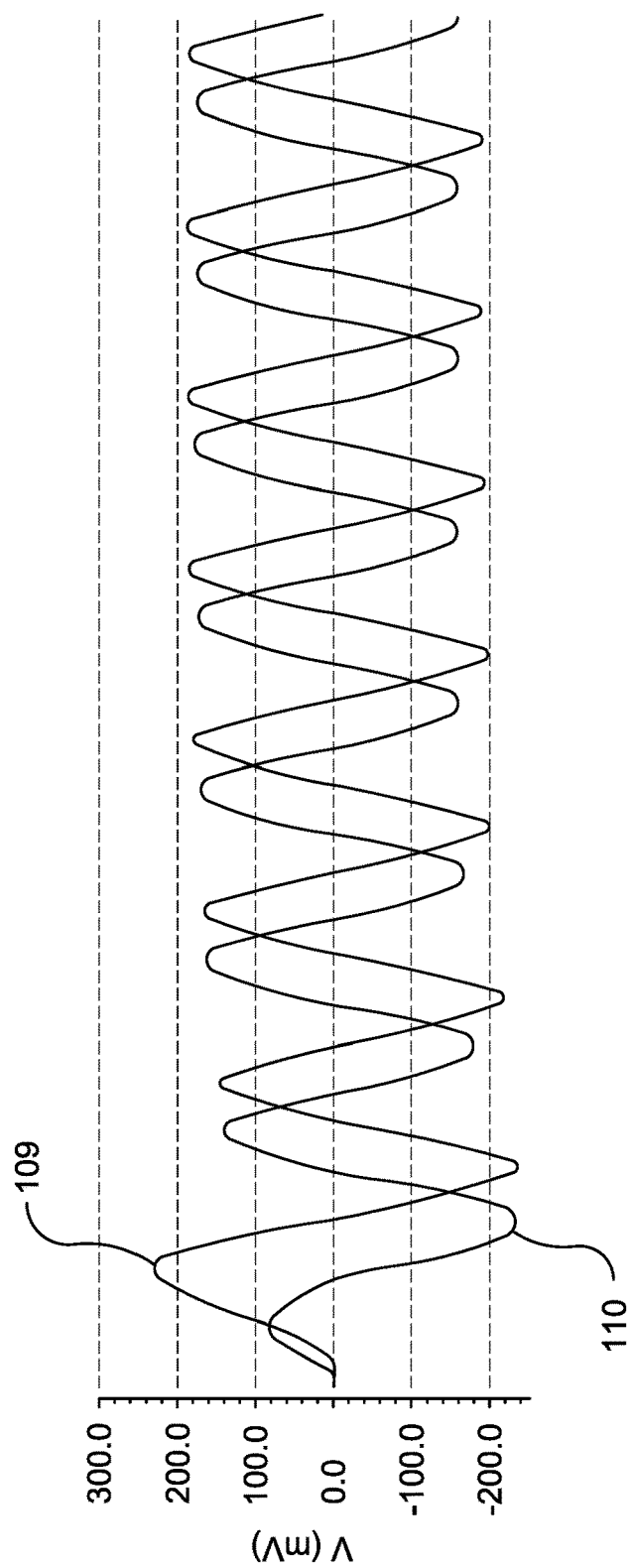
FIG. 5 is a graph illustrating an exemplary output quadrature waveform from a quadrature filter of a timing generator according to an embodiment of the disclosure.

In addition to first clock signal 209, ADC 201 may require multiple square wave replicas of input signal 102 with varying delay and duty cycle requirements for a given sub-ranging or switched-capacitance converter architecture, by way of example only. Second output signal 107 from clock buffer 104 serves as a reference signal for the generation of these additional clock signals to be generated by the system for distribution over the ADC chain. More specifically, as illustrated, second output signal 107 is received by a quadrature (I/Q) filter 108. Quadrature filter 108 is configured to output I/Q or quadrature differential waveforms 109 (I) and 110 (Q). Exemplary quadrature waveforms 109,110 are shown in FIG. 5. These waveforms will be subsequently processed by double vector sum and other logic circuits implemented as common model logic (CML) circuits to generate a series of timing or clock signals with independent 360 degree phase skew and duty cycle controls for supplying throughout ADC 201.

Still referring to FIG. 2, quadrature waveforms 109,110 are distributed to each of a plurality (e.g., three as shown) of I/Q differential pair buffer amplifiers 112 arranged in parallel. Buffer amplifiers 112 are configured to distribute I/Q current mode output clock signals 113 to a plurality of respective remotely-located clock domains or clock domain sub-circuits 203,205,207 (i.e., remotely-located proximate respective converter stages). The use of current mode signals to distribute clock signals 113 is advantageous, as distances between buffer amplifiers 112 and the illustrated clock domains may be significant enough to result in excess losses to voltage mode signals, and therefor reductions in system performance.

As set forth above, each clock domain may be configured to generate timing signals for controlling a given stage of ADC 201. For example, ADC 201 may comprise four to eight stages of ADC quantization depending on resolution division of each of the stages, such as 4-4-4 for a subranging ADC with 2 bit overrange or 2.5-1.5-1.5-1.5-1.5-4 10 bit switched cap ADCs with 2.5 bit overrange. Each clock domain may require three to five sets of clock signals (three, as illustrated in exemplary FIG. 2) in total for the inner mixed signal circuits in the stage. Each clock domain includes an I/Q emitter-follower (EF) buffer cascode amplifier 114. Amplifiers 114 are configured to reconstruct the current mode clock signal 113 back to the voltage domain, and to configured to produce a number of differential waveform replicas or I/Q vectors 115 required (e.g., three) for a given clock domain.

Each I/Q vector 115, or pairs of I/Q vector 115, is distributed to a respective vector sum circuit 116. Vector sum circuits 116 are configured to time delay an input clock to achieve a desired edge control. This edge control provides the vector sum circuit with the ability to vary the resultant clock pulse width from 0-50%. More specifically, each vector sum circuit 116 is configured to weight each of the received differential I and Q input components of the I/Q vectors 115 according to received input control signals 117. The weighted I and Q components are then summed for altering clock skew in a desired manner. Control signals 117 for weighting the I and Q signal components may be generated by a digital-to-analog converter (DAC, not shown), providing fine control of the clock skew. It should be understood that each output clock signal requires varying time and duty cycle delays due to relative spatial positioning of components of the receiving circuits. These phase skew and duty cycle settings may also vary from chip-to-chip due to the process variations of the devices and traces of the timing circuit. Accordingly, having an on-board digital interface inside within a given chip, one can calibrate the correct skew and duty cycle delay settings for optimal ADC performance.

Figure 3:
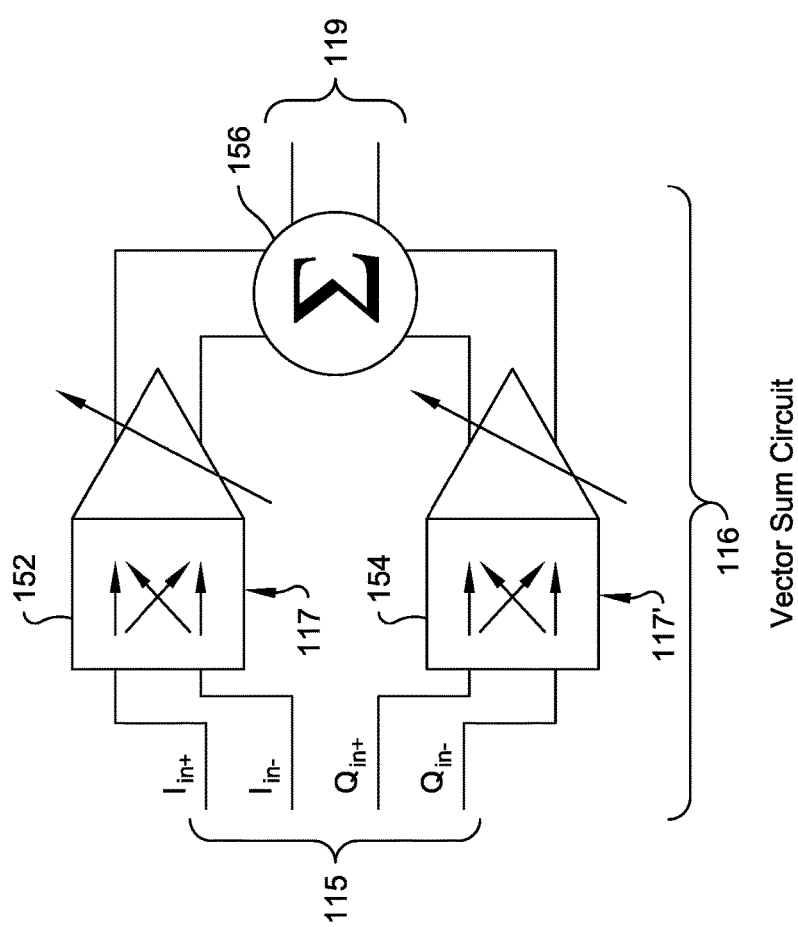
FIG. 3 is a block diagram of a portion of a vector sum circuit according to an embodiment of the disclosure.

FIG. 3 provides a high-level block diagram of a portion of an exemplary vector sum circuit 116. Vector sum circuit 116 receives differential I/Q vectors or signal 115 and includes weighting components 152,154. Weighting components 152,154 are configured to selectively weight respective I and Q components according to received control signals 117, 117'. It should be understood that while a single control signal 117,117' is shown as being input to a respective weighting component 152,154, in embodiments, both the + and − components of the differential signal for each of the I and Q components may be individually and discretely weighted. The resulting weighted I and Q components are then summed at summer 156 to produce differential output signal 119 having a desired phase or phase shift. While the vector sum circuit shown in FIG. 3 illustrates a single differential I/Q input signal 115, vector sum circuits according to embodiments of the present disclosure may comprise so-called "double" vector sum circuits (or essentially two of the circuits shown in FIG. 3), configured to receive two differential I/Q input signals, as illustrated in FIG. 2. A vector sum circuit useful for implementation into the timing generators described herein is shown and described un U.S. Pat. No. 9,231,559, which is incorporated by reference herein.

Referring again to FIG. 2, each vector, or double vector, sum circuit 116 outputs two shifted differential clock output signals 119 that have been skewed relative to each other. These outputs are provided to a buffer amplifier 120, and fed through a combinatorial current mode logic (CML) AND component 122 for duty cycle control. AND 122 component combines the two differential outputs from the double vector sum outputs and can control 0-50% duty clock or 50-100% duty clock by inverting polarity and with the accompanying phase skew function of vector sum circuits 116, the duty cycle can then be controlled down to less than 15% duty cycle. Resulting clock signals are output to respective amplifiers 124. Amplifiers 124 act timing drivers configured to drive the resulting clock signals to their respective destinations. As would be understood from FIG. 2, the components of only clock domain 203 are shown, with clock domains 205,207 comprising like features.

Figure 6:
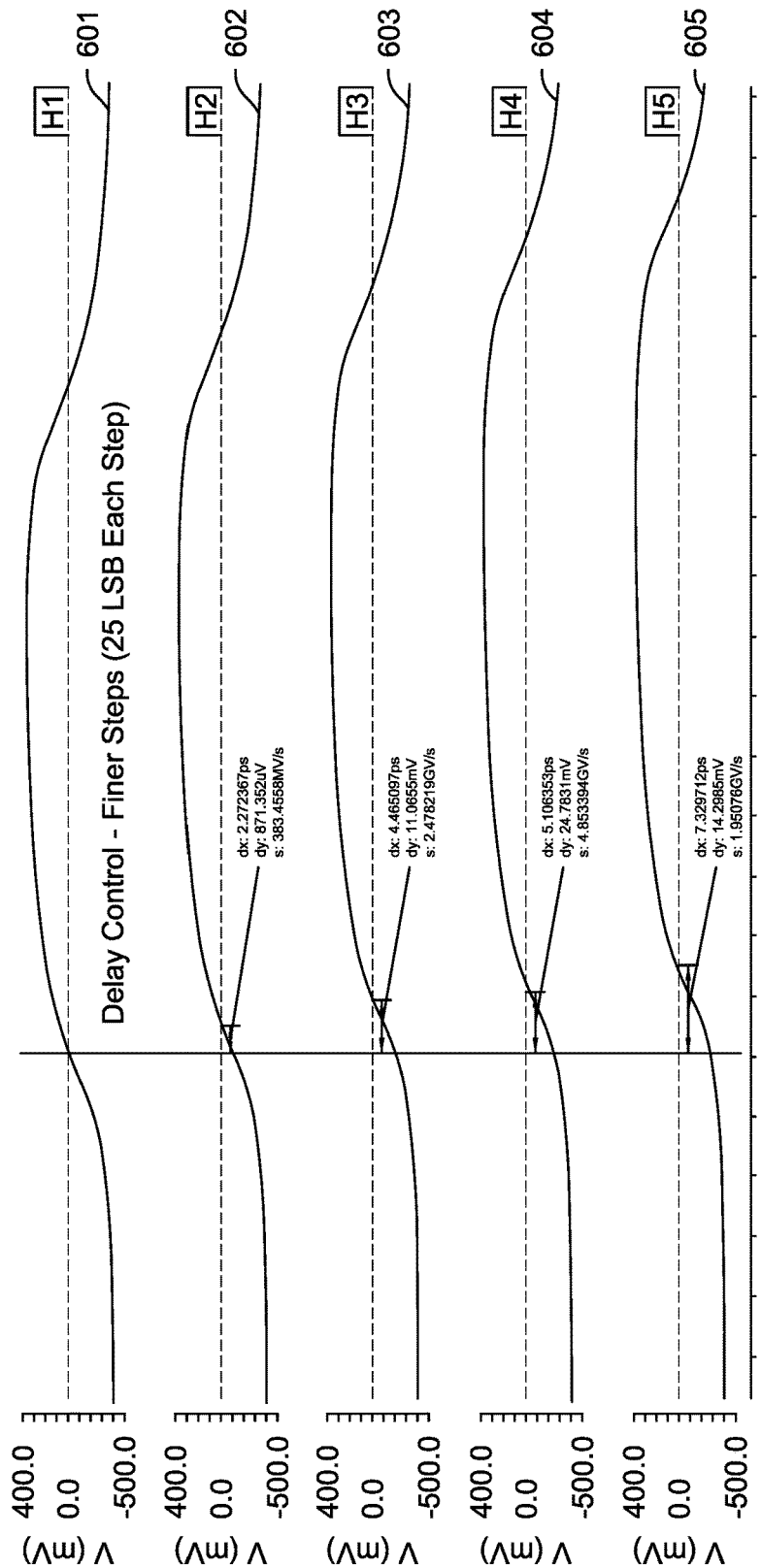
FIG. 6 is a graph illustrating exemplary output waveforms of vector sum amplifiers or circuits of a timing generator according to an embodiment of the disclosure.
Figure 7:
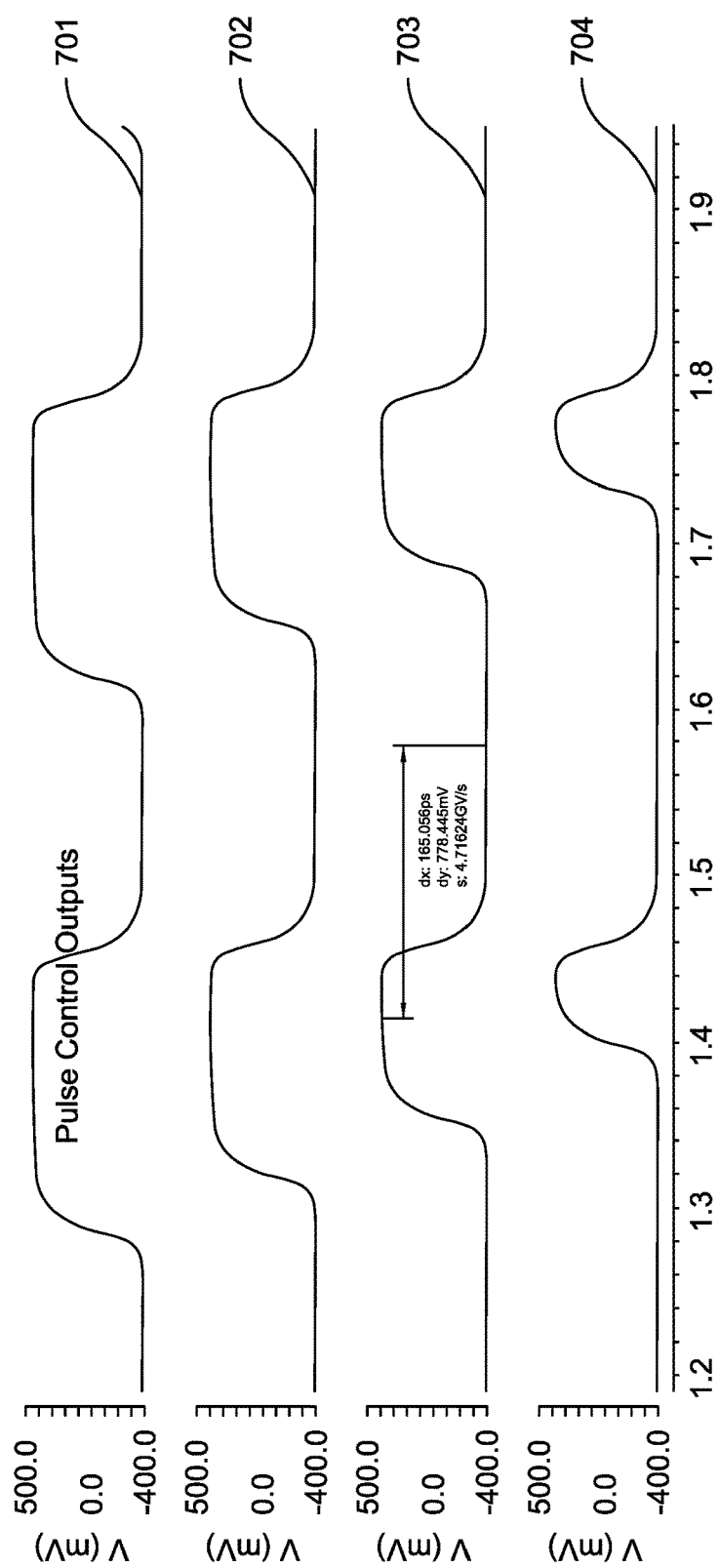
FIG. 7 is a graph illustrating exemplary output waveforms of an AND logic gate of a timing generator according to an embodiment of the disclosure.

FIG. 6 shows outputs of an exemplary vector sum circuit wherein output when the I and Q input components are summed inside to generate an output that can be phase skewed via a static digital to analog converter (DAC) settings from 0 to full period coverage in sub picosecond steps. An output clock signal 601 of zero shift is shown, as well as additional output clock signals 602,603,604,605 each delayed approximately 2 picoseconds (ps) through the 20 lower significant bits (LSBs) of DAC settings may be set through digital control via serial peripheral interface (SPI) that resides inside ADC 201. FIG. 7 illustrates final output signals 701,702,703,704 after the operation of AND gates 122.

Figure 8:
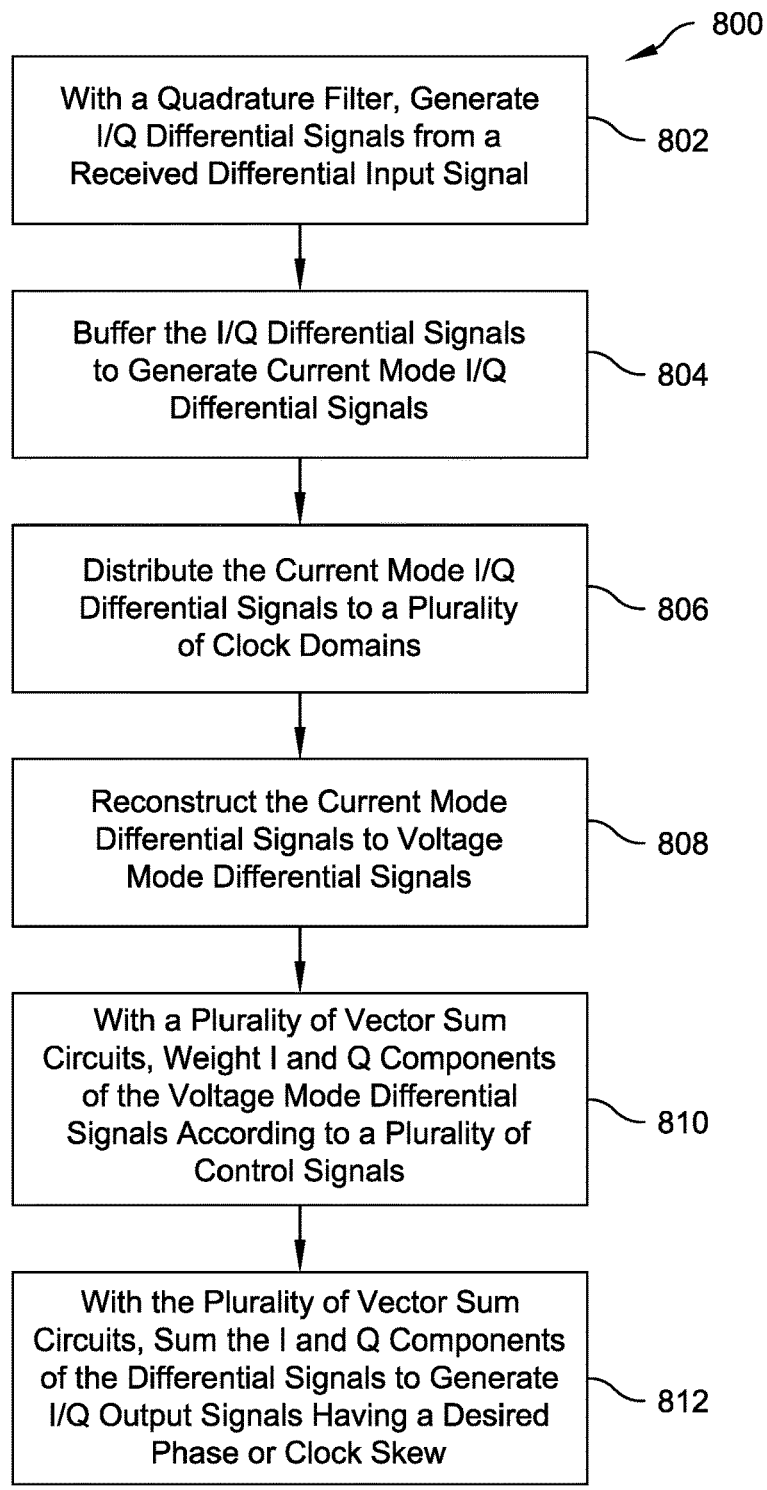
FIG. 8 is a high-level process flow diagram illustrating an exemplary method useful for generating a clock signal according to an embodiment of the present disclosure.

FIG. 8 provides a high-level flow diagram illustrating a signal processing method 800 useful for generating a plurality of clock signals with a timing generator according to embodiments of the present disclosure. As set forth above with respect to FIG. 2, method 800 includes the step generating 802 a plurality of differential I/Q signals from a receive differential input signal via a quadrature filter. The differential I/Q signals are buffered 804 with a plurality of differential pair amplifiers to generate current mode differential I/Q signals to be distributed 806 to a plurality of clock domains. At the clock domains, the current mode differential I/Q signals are reconstructed 808 or converted to voltage mode differential I/Q signals and provided to a plurality of vector sum circuits. The I and Q components of the voltage mode differential I/Q signals are weighted 810 according to a plurality of control signals received by the vector sum circuits. I and Q components of the weighted voltage mode differential I/Q signals are then summed 812 by the vector sum circuits for generating differential output signals having a desired phase or clock skew.

Timing generators and methods of operation thereof according to the above-described embodiments are open-loop by design in contrast to more common feedback-based timing approaches such as delay lock loop (DLL). Fine phase skews with very low temperature drifts in the 50 femtosecond region brought forth by the vector sum circuits facilitates the robustness of the open loop timing design for high speed ADC's in gigasample (GS/s) clock rates required by many modern ADCs.

It is to be understood that the figures and descriptions of the present invention have been simplified to illustrate elements that are relevant for a clear understanding of the present invention, while eliminating, for purposes of clarity, many other elements found in frequency translation devices, including regenerative frequency dividers. However, because such elements are well known in the art, and because they do not facilitate a better understanding of the present invention, a discussion of such elements is not provided herein. The disclosure herein is directed to all such variations and modifications known to those skilled in the art.

While the foregoing invention has been described with reference to the above-described embodiment, various additional modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. An integrated circuit comprising:
a timing generation circuit configured to generate at least one clock signal, comprising:
an input clock buffer configured to receive an input differential signal;
a quadrature filter operatively connected to an output of the clock buffer;
a first quadrature (I/Q) buffer amplifier operatively connected to an output of the quadrature filter;
a second I/Q buffer amplifier operatively connected to the first I/Q buffer amplifier; and
at least one first vector sum circuit responsive to a differential output I/Q signal of the second I/Q buffer amplifier and at least one input control signal and configured to weight and sum I and Q components of the output I/Q signal for generating the at least one clock signal.

2. The integrated circuit of claim 1, wherein the second I/Q buffer amplifier is configured to divide an I/Q signal output from the first I/Q buffer amplifier into a plurality of output I/Q signals.

3. The integrated circuit of claim 2, wherein the at least one first vector sum circuit comprises a plurality of first vector sum circuits each operatively connected to one of the plurality of output I/Q signals from the second I/Q buffer amplifier.

4. The integrated circuit of claim 2, further comprising:
a third I/Q buffer amplifier arranged in parallel with the first I/Q buffer amplifier and operatively connected to the output of the quadrature filter;
a fourth I/Q buffer amplifier operatively connected to an output of the third I/Q buffer amplifier; and
at least one second vector sum circuit responsive to an output I/Q signal of the fourth I/Q buffer amplifier and at least one input control signal and configured to weight and sum I and Q components of the output I/Q signal of the fourth I/Q buffer amplifier for generating at least one additional clock signal.

5. The integrated circuit of claim 4, wherein the second I/Q buffer amplifier and the at least one first vector sum circuit define a first clock domain configured to supply a first plurality of clock signals to a first stage of a multi-stage ADC, and wherein the fourth I/Q buffer amplifier and the at least one second vector sum circuit define a second clock domain configured to supply a second plurality of clock signals to a second stage of a multi-stage ADC.

6. The integrated circuit of claim 4, wherein the fourth I/Q buffer amplifier is configured to divide the I/Q signal output from the third I/Q buffer amplifier into a plurality of output I/Q signals.

7. The integrated circuit of claim 6, wherein the at least one second vector sum circuit comprises a plurality of second vector sum circuits each operatively connected to one of the plurality of output I/Q signals from the fourth I/Q buffer amplifier.

8. The integrated circuit of claim 1, wherein the first I/Q buffer amplifier comprises a differential amplifier configured to output a current mode signal.

9. The integrated circuit of claim 1, wherein the second I/Q buffer amplifier comprises an emitter-follower cascode amplifier configured to output a voltage mode signal.

10. An integrated circuit comprising:
an analog-to-digital converter (ADC) including a first track and hold amplifier; and
a timing generator configured to generate a clock signal for controlling the ADC, including:
a quadrature filter responsive to a differential input signal for generating a differential quadrature (I/Q) output signal; and
at least one first vector sum circuit operatively connected to the output of the quadrature filter and configured to weight and sum components of the differential I/Q output signal for generating a desired clock signal.

11. The integrated circuit of claim 10, wherein the timing generator further comprises:
an input clock buffer operatively connected at an output thereof to an input of the quadrature filter and configured to receive the differential input signal;
a first I/Q buffer amplifier operatively connected to an output of the quadrature filter; and
a second I/Q buffer amplifier operatively connected to the first I/Q buffer amplifier,
wherein the at least one first vector sum circuit is operatively connected to an output of the second I/Q buffer.

12. The integrated circuit of claim 11, wherein the second I/Q buffer amplifier is configured to divide the I/Q signal output from the first I/Q buffer amplifier into a plurality of output I/Q signals.

13. The integrated circuit of claim 12, wherein the at least one first vector sum circuit comprises a first plurality of first vector sum circuits each operatively connected to one of the plurality of output I/Q signals from the second I/Q buffer amplifier.

14. The integrated circuit of claim 11, further comprising:
a third I/Q buffer amplifier arranged in parallel with the first I/Q buffer amplifier and operatively connected to the output of the quadrature filter;
a fourth I/Q buffer amplifier operatively connected to the third I/Q buffer amplifier; and
at least one second vector sum circuit responsive to an output I/Q signal of the fourth I/Q buffer and configured to weight and sum components of the differential I/Q output signal of the fourth I/Q buffer for generating an additional desired clock signal.

15. The integrated circuit of claim 14, wherein the second I/Q buffer amplifier and the at least one first vector sum circuit define a first clock domain configured to supply a plurality of clock signals to a first stage of the ADC, and wherein the fourth I/Q buffer amplifier and the at least one second vector sum circuit define a second clock domain configured to supply a plurality of clock signals to a second stage of a multi-stage ADC.

16. A method of generating a clock signal in an integrated circuit, the method comprising the steps of:
buffering a differential input clock signal with an input clock buffer;
receiving the buffered differential input clock signal with a quadrature filter for generating a differential quadrature (I/Q) output signal;
buffering the differential I/Q output signal with a first quadrature (I/Q) buffer amplifier operatively connected to an output of the quadrature filter and a second I/Q buffer amplifier operatively connected to the first I/Q buffer amplifier;
with a vector sum circuit, weighting differential I and Q components of the differential I/Q output signal according to received control signals; and with the vector sum circuit, summing the differential I and Q components of the differential I/Q output signal for generating a first output clock signal.

17. The method of claim 16, wherein the step of buffering the I/Q output signal comprises buffering the I/Q output signal with a first I/Q buffer amplifier, and buffering an output of the first I/Q buffer amplifier with a second I/Q buffer amplifier.

18. The method of claim 17, wherein the step of buffering the differential I/Q output signal further comprises buffering the differential I/Q output signal with a third I/Q buffer amplifier arranged in parallel with the first I/Q buffer amplifier for generating a second differential I/Q output signal.

19. The method of claim 18, further comprising the steps of:
   with a second vector sum circuit, weighting differential I and Q components of the second differential I/Q output signal according to received control signals; and
   with the vector sum circuit, summing the differential I and Q components of the second differential I/Q output signal for generating a second output clock signal.

20. The method of claim 16, wherein the step of buffering the differential I/Q output signal converting the differential I/Q output signal to a current mode signal.

\* \* \* \* \*